(12) United States Patent
Bayne et al.

(10) Patent No.: US 7,786,559 B2
(45) Date of Patent: Aug. 31, 2010

(54) BEZEL PACKAGING OF FRIT-SEALED OLED DEVICES

(75) Inventors: John F Bayne, Elmira, NY (US); Jamie T Westbrook, Gillett, PA (US); Sujanto Widjaja, Corning, NY (US)

(73) Assignee: Corning Incorporated, Corning, NY (US)

( * ) Notice: Subject to any disclaimer, the term of this patent is extended or adjusted under 35 U.S.C. 154(b) by 933 days.

(21) Appl. No.: 11/594,487

(22) Filed: Nov. 8, 2006

(65) Prior Publication Data

US 2008/0120946 A1    May 29, 2008

(51) Int. Cl.
*H01L 21/00* (2006.01)
(52) U.S. Cl. .................... 257/678; 438/125
(58) Field of Classification Search .......... 257/668, 257/678; 53/396, 167; 438/106, 121, 116, 438/125
See application file for complete search history.

(56) References Cited

U.S. PATENT DOCUMENTS

| 5,479,285 | A | 12/1995 | Burke | 359/83 |
| 6,998,776 | B2 | 2/2006 | Aitken et al. | 313/512 |
| 7,157,153 | B2 | 1/2007 | Yamada et al. | 428/688 |
| 7,323,814 | B2 | 1/2008 | Miyazaki et al. | 313/495 |
| 2003/0155861 | A1* | 8/2003 | Nishizawa et al. | 313/512 |
| 2004/0020823 | A1 | 2/2004 | Yoshizawa | 206/706 |
| 2006/0044490 | A1 | 3/2006 | Ichioka et al. | 349/58 |
| 2006/0050221 | A1 | 3/2006 | Kim | 349/149 |
| 2006/0087601 | A1 | 4/2006 | Lee | 349/60 |
| 2007/0170324 | A1 | 7/2007 | Lee et al. | 248/247 |

FOREIGN PATENT DOCUMENTS

| EP | 1814178 A2 | 8/2007 |
| JP | 2000085847 | 3/2000 |
| JP | 10-2005-0070543 | 7/2005 |
| KR | 10-2006-0026821 | 3/2006 |
| TW | I247552 | 1/2006 |

OTHER PUBLICATIONS

Anonymous, "Mounting Method For Liquid Crystal display" Nov. 16, 2007 IBM Corp.
Bilsback "Plasma Display Resilient Frame Mount", vol. 26, No. 4, Sep. 1983 IBM.
Bilsback, "Plasma Panel Packaging", vol. 26, No. 4, Sep. 1983, IBM.

\* cited by examiner

*Primary Examiner*—Roy K Potter
(74) *Attorney, Agent, or Firm*—Bruce P. Watson

(57) ABSTRACT

Methods and assemblies relate to bezel packaging of a sealed glass assembly, such as a frit-sealed OLED device. The bezel packaging includes a shock absorbent intermediate layer of low modulus of elasticity material applied between the sealed glass assembly and the bezel. A bonding agent, which may include the low modulus of elasticity material and/or a separate bonding material, affixes the sealed glass assembly to the bezel. Bezel modifications may be made to stabilize the bezel. Exemplary bezel modifications include reinforced bezel side walls and supporting straps attached between bezel walls. The bezel design may include a gap between the edges of the sealed glass assembly and the bezel walls, so as to avoid direct contact therewith. The gap may be filled at least in part with low modulus of elasticity organic adhesive to provide additional shock absorbency. The low modulus of elasticity material may include foam, ceramic fiber cloth and/or a low modulus of elasticity polymeric organic coating.

27 Claims, 4 Drawing Sheets

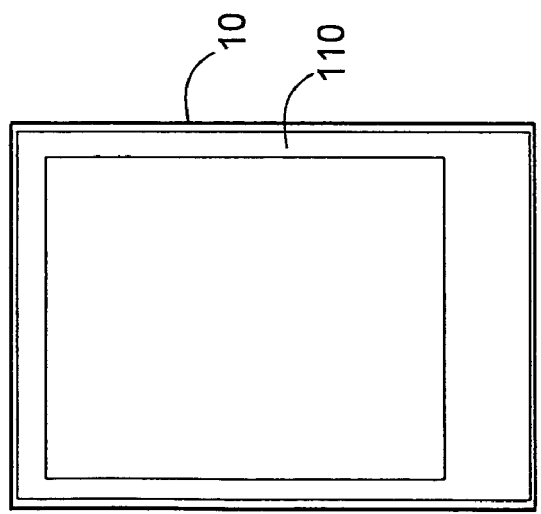
FIG. 1A
100
FIG. 2A
200
FIG. 3A
300
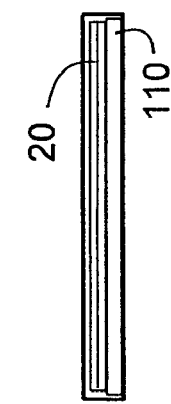
FIG. 1B
FIG. 2B
FIG. 3B

400

500

600

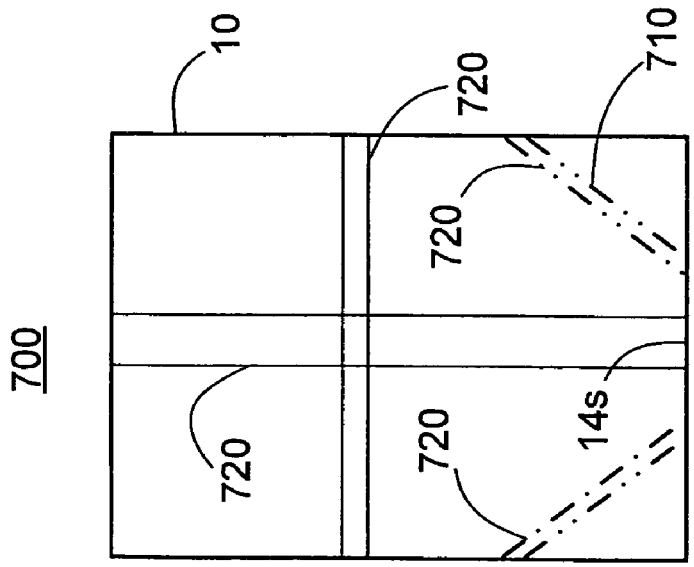

BEZEL PACKAGING OF FRIT-SEALED OLED DEVICES

BACKGROUND

1. Field of Invention

The present invention relates to methods and apparatus relating to bezel packaging of a sealed glass assembly, such as for use in an organic light emitting diode (OLED) display, and in particular to bezel packaging of frit-sealed OLED devices.

2. Description of Related Art

Producing flat product glass assemblies for OLED displays involves many challenges. A key requirement in this process is the ability to package the displays in such as manner as to balance cost, performance, stability and durability. Displays based on organic light emitting diode (OLED) technology are sensitive to many factors, such as to the diffusion of oxygen and moisture into the OLED display, on the one hand, and to mechanical shock, on the other hand.

To protect against the chemically based sensitivity factors, manufacturers typically attempt to hermetically seal OLED glass assemblies as best as manufacturing parameters permit. To protect against the factors undermining structural integrity, the hermetically sealed glass assembly then is packaged in a bezel that provides a support structure for the glass assembly and a protective shell around the glass assembly. However, as technological advances are rarely synchronized, improvements in hermetic sealing may not protect the structural integrity of the glass assembly, and improvements in protecting the structural integrity may not improve the hermetic seal.

It would therefore be desirable to further improve the packaging technology applicable to the manufacture of hermetically sealed glass assemblies, such as OLED-frit sealed devices, to achieve improved stability of the packaged hermetically sealed glass assembly and its hermetic seal, while minimizing the challenges and costs associated with creating a reliable consumer product.

SUMMARY OF THE INVENTION

In order to mitigate the potential for failure due to impact, an approach of the present invention is to re-design the bezel and packaging that is used to hold the sealed display assembly. The bezel is used ultimately as a main component of the final packaging of a functional display device.

In accordance with one or more embodiments of the present invention, methods and apparatus relate to bezel packaging for sealed glass assemblies, such as OLED-frit sealed devices or glass assemblies for use in liquid crystal displays, using low-modulus of elasticity compliant shock/impact absorbing material for and in the bezel.

According to one or more embodiments of the present invention, a method of packaging a sealed glass package includes: applying a material with a low elastic modulus to either the sealed glass assembly or the bezel; applying a bonding agent between the sealed glass assembly and the bezel; and placing the sealed glass assembly in the bezel so that the bonding agent tightly holds the sealed glass assembly to the bezel and the material forms a shock absorbent intermediate layer between the sealed glass assembly and the bezel.

According to one or more embodiments of the present invention, the method further may include aligning the sealed glass assembly in the bezel so that a clearance gap exists between edges of the sealed glass assembly and walls of the bezel; providing an organic adhesive between edges of the sealed glass assembly and walls of the bezel; enabling the bonding agent to set; and/or modifying the bezel with at least one bezel modification that stabilizes the bezel.

According to one or more embodiments of the present invention, an assembly for bezel packaging of a sealed glass assembly may include a shock absorbent intermediate layer of low modulus of elasticity material applied between the sealed glass assembly and a bezel. A bonding agent may affix the sealed glass assembly to the bezel. Bezel modifications may be made to stabilize the bezel. Exemplary bezel modifications may include reinforced bezel side walls and/or supporting straps attached between bezel walls. The bezel may be designed so that a gap exists between the edges of the sealed glass assembly and the bezel walls to avoid direct contact therewith. The gap may be filled at least in part with low modulus of elasticity organic adhesive to provide additional shock absorbency. The low modulus of elasticity materials may include foam, ceramic fiber cloth and/or a low modulus of elasticity polymeric organic coating.

The advantages of this invention are best understood after reading the detailed technical description, and in relation to existing glass handling and processing systems. Nonetheless, the present invention primarily improves mechanical reliability of the bezel packaging of a hermetically sealed glass assembly sensitive to the ambient environment, such as devices used for OLED applications. Other advantages may include provision of a bezel packaging suitable to protect the hermetic seal while demonstrating significant improvement in the mechanical impact/shock resistance.

The present invention improves mechanical integrity and reliability of the sealed devices by mitigating impact-induced high stresses that can lead to cracking and delamination of the sealed glass assembly. In accordance with some aspects of the present invention, a reduction of localized bending and contact stresses at certain areas may improve the bonding integrity and resistance to failure of the sealed-devices, and thus, extend the lifetime of the devices. The present invention also may enhance mechanical bonding between glass plates of a glass assembly, in addition to improving hermeticity offered by a frit-seal.

In general, this added stability potentially extends the product life of the glass assembly/OLED display, particularly due to the improved protection of the improved hermetic seal.

Other aspects, features, advantages, etc. will become apparent to one skilled in the art when the description of the invention herein is taken in conjunction with the accompanying drawings.

BRIEF DESCRIPTION OF THE DRAWINGS

For the purposes of illustrating the various aspects of the invention, wherein like numerals indicate like elements, there are shown in the drawings simplified forms that may be employed, it being understood, however, that the invention is not limited by or to the precise arrangements and instrumentalities shown, but rather only by the issued claims. The drawings may not be to rendered scale, and the aspects of the drawings may not be rendered to scale relative to each other.

FIGS. 1A-1B are block diagrams of top and front views, respectively, of a bezel packaging configuration in accordance with one or more embodiments of the present invention;

FIGS. 2A-2B are block diagrams of top and front views, respectively, of an alternative bezel packaging configuration in accordance with one or more further embodiments of the present invention;

FIGS. 3A-3B are block diagrams of top and front views, respectively, of an alternative bezel packaging configuration in accordance with one or more still further embodiments of the present invention;

FIGS. 7A-7B are block diagrams of top and front views, respectively, of an alternative bezel packaging configuration in accordance with one or more still further embodiments of the present invention;

FIG. 8 is a front view of an alternative bezel packaging configuration in accordance with one or more further embodiments of the present invention;

FIG. 9 is a front view of an alternative bezel packaging configuration in accordance with one or more further embodiments of the present invention.

DETAILED DESCRIPTION OF THE PRESENT INVENTION

Figure 4A:
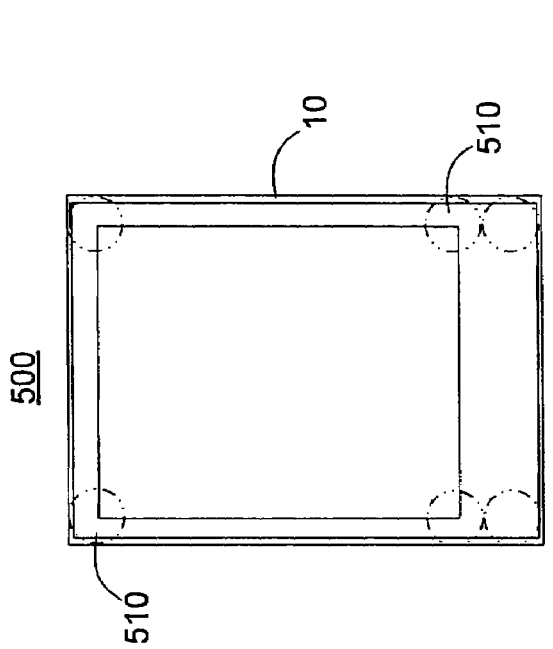
FIGS. 4A-4B are block diagrams of top and sectional views, respectively, of an alternative bezel packaging configuration in accordance with one or more still further embodiments of the present invention.

As an example of a sealed glass assembly, a hermetically sealed OLED glass assembly is manufactured by providing a first substrate glass plate and a second substrate glass plate, depositing organic light emitting diodes on the first substrate glass plate, and sealing the first and second glass substrates. After being sealed, such as with an epoxy, the glass assembly typically is inserted into a bezel, and a layer of adhesive tape typically is placed between the glass assembly and the bezel to hold the sealed glass assembly firmly into the bezel.

By way of example, the product glass may comprise CORNING INCORPORATED GLASS COMPOSITION Code 1737 or CORNING INCORPORATED GLASS COMPOSITION Code EAGLE$^{2000}$™. These glass materials have numerous uses, in particular, for example, the production of displays, also including liquid crystal displays.

Organic light emitting diodes have been the subject of a considerable amount of research in recent years because of their use and potential use in a wide variety of electroluminescent devices. For instance, a single OLED can be used in a discrete light emitting device or an array of OLEDs can be used in lighting applications or flat-panel display applications (e.g., OLED displays). The OLED displays are known as being very bright and having a good color contrast and wide viewing angle. However, the OLED displays and in particular the electrodes and organic layers located therein are susceptible to degradation resulting from interaction with oxygen and moisture leaking into the OLED display from the ambient environment. The life of the OLED display can be increased significantly if the electrodes and organic layers within the OLED display are hermetically sealed from the ambient environment.

Historically, it was very difficult to create a very effective hermetic seal for an OLED display. For instance, the hermetic seal should provide a barrier for oxygen ($10^{-3}$ cc/m$^2$/day) and water ($10^{-6}$ g/m$^2$/day). Moreover, the temperature generated during the sealing process should not damage the materials (e.g., electrodes and organic layers) within the OLED display. For instance, the OLED pixels located within 1-2 mm of the seal in the OLED display should not be heated to more than 100 degrees Celcius during the sealing process. In addition, the gases released during sealing process should not contaminate the materials within the OLED display. Lastly, the hermetic seal needs to enable electrical connections (e.g., thin-film chromium) to enter the OLED display.

A common way to seal an OLED display is to use various types of epoxies, inorganic materials and/or organic materials that form the seal after they are cured by ultra-violet light. For example, Vitex systems manufactures and sells a coating under the brand name of Barix™, which is a composite based approach where alternate layers of inorganic materials and organic materials can be used to seal the OLED display. Although these types of seals usually provide acceptable mechanical strength, they can be very expensive and there are many instances in which they have failed to prevent the diffusion of oxygen and moisture into the OLED display. Another common way for sealing the OLED display is to utilize metal welding or soldering, however, the resulting seal is not durable in a wide range of temperatures because of the substantial differences between the coefficients of thermal expansions (CTEs) of the glass plates and metal in the OLED display.

Insofar as these commonly employed methods to seal display structures (such as using organic adhesives with a desiccant cavity) might not be effective to provide hermetic sealing for OLED structures, new sealing methods have been developed. One such non-epoxy-based method of fabrication of a hermetically sealed glass package involves using a frit.

A glass assembly having a frit-based seal may be made as set forth in U.S. Pat. No. 6,998,776 to Aitken, et al. ("'776"). Using an OLED display as an example, the '776 patent describes a hermetically sealed glass package and method for manufacturing the hermetically sealed glass package. Basically, the hermetically sealed OLED display is manufactured by providing a first substrate plate and a second substrate plate, depositing OLEDs on the first substrate plate, and depositing a frit onto the second substrate plate. After combining the first and second substrate plates with the OLEDs in between, an irradiation source (e.g., laser, infrared light) is then used to heat the frit, which melts and forms a hermetic seal that bonds the first substrate plate to the second substrate plate and also protects the OLEDs. The frit is glass that was doped with at least one transition metal and possibly a filler to lower the coefficient of thermal expansion of the frit, such that when the irradiation source heats the frit, it softens and forms a bond. This enables the frit to melt and form the hermetic seal while avoiding thermal damage to the OLEDs.

However, due to the inherent brittle nature of the glass/frit/glass seal, the sealed glass assembly by itself is sensitive to any form of impact and shock loading. In order to mitigate the potential for failure due to impact, the approach of the present invention is to re-design the bezel and packaging that is used to hold the sealed display assembly. The bezel is used ultimately as a main component of the final packaging of a functional display device.

For purposes of the present discussion, the sealed device introduced below may be any sealed glass assembly, independent of the method of sealing. However, emphasis is placed on frit-sealed glass packages, insofar as frit-sealed devices are more sensitive to impact at the seal due to the brittle nature of the frit seal. Hence, frit-sealed devices are more likely to benefit from the improved structural stability offered by the bezel packaging of the present invention. Unless otherwise indicated, the sealed devices of the following figures are interchangeable frit-sealed glass assemblies, such as frit-sealed OLED glass assemblies for use in OLED displays.

Referring to FIG. 1A and FIG. 1B, block diagrams illustrate a top view and a front view, respectively, of a first exemplary bezel packaging configuration 100 in accordance with one or more embodiments of the present invention. The first bezel packaging configuration 100 may include a bezel 10 and a shock absorbent layer such as ceramic fiber insulation layer 110 having a thickness of about 0.005-0.1 inches (about 0.0127-0.254 cm). The insulation layer or cloth 110 supports the sealed device 20 and isolates it from the bezel 10. The bezel 10 may be made of metal, such as aluminum and steel, or hard plastic, as is discussed more below.

Referring to FIG. 2A and FIG. 2B, block diagrams illustrate a top view and a front view, respectively, of a second exemplary bezel packaging configuration 200 in accordance with one or more embodiments of the present invention. The second bezel packaging configuration 200 may include a bezel 10 and a substantially uniform shock absorbent layer (about 0.005-0.1 inch-thick) of low modulus of elasticity polymer coating 210 supporting the sealed device 20. Any shape/geometry of polymer coating 210 is acceptable to provide the function of supporting the sealed device 20 and isolating it from the bezel 10, such as lines of organic adhesive applied in the location beneath the frit-sealed lines of the sealed device 20. The layer 210 may cover part or substantially all of the device 20 surface that adjoins the bezel 10.

Referring to FIG. 3A and FIG. 3B, block diagrams illustrate a top view and a front view, respectively, of a third exemplary bezel packaging configuration 300 in accordance with one or more embodiments of the present invention. The third exemplary bezel packaging configuration 300 may include a bezel 10 and several droplets 310 of low modulus of elasticity polymer coating (such as a polymeric adhesive) supporting the sealed device 20. The droplets 310 may have a thickness of about 0.005-0.1 inch (about 0.0127-0.254 cm) and may be located near the bezel corners 12 and sealed device corners 22, such as display corners 22d and frit-seal corners 22f.

Figure 4B:

Referring to FIG. 4A and FIG. 4B, block diagrams illustrate a top view and a sectional view, respectively, of a fourth exemplary bezel packaging configuration 400 in accordance with one or more embodiments of the present invention. The fourth bezel packaging configuration 400 may include a bezel 10 and a center application 410 of a low modulus of elasticity material, such as a polymeric adhesive, supporting the center, allowing the corners 22 and edges 24 of the sealed device 20 to flex, such as edges 24d of the display area and/or edge 24f of the frit-seal area.

Figure 5A:
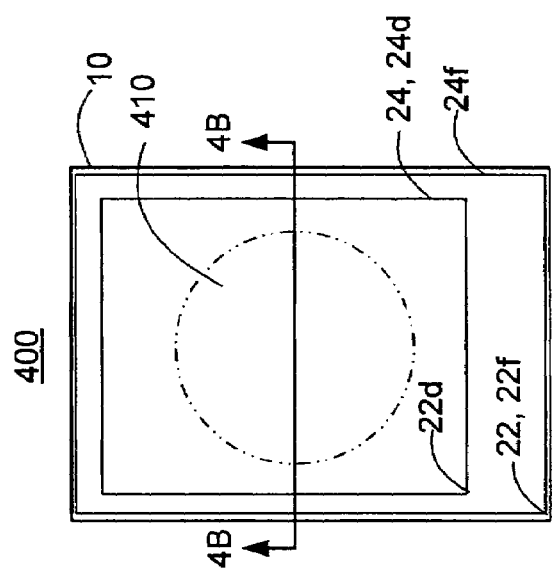
FIGS. 5A-5B are block diagrams of top and sectional views, respectively, of an alternative bezel packaging configuration in accordance with one or more still further embodiments of the present invention.
Figure 5B:

Referring to FIG. 5A and FIG. 5B, block diagrams illustrate a top view and a front view, respectively, of a fifth exemplary bezel packaging configuration 500 in accordance with one or more embodiments of the present invention. The fifth bezel packaging configuration 500 may include a bezel 10 and a low modulus of elasticity foam material 510 supporting the corners 22 of the sealed device 20. The foam material 510 can be mounted to the bezel 10 using any adhesive tape.

Figure 6:
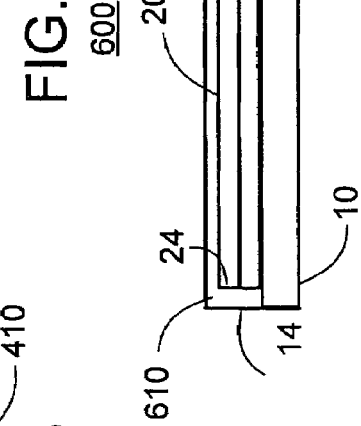
FIG. 6 is a front view of an alternative bezel packaging configuration in accordance with one or more further embodiments of the present invention.

Referring to FIG. 6, a block diagram illustrates a front view of a sixth exemplary bezel packaging configuration 600 in accordance with one or more embodiments of the present invention. The sixth bezel packaging configuration 600 may include a bezel 10 and a desirable gap tolerance 610 between walls 14 of bezel 10 and edges 24 of sealed device 20 to prevent any direct contact of the two components. Direct contact between the bezel 10 and the sealed device 20 is avoided because it may cause contact damage or stress in response to any form of external loading. In one or more embodiments, an exemplary tolerance 610 may be equal to or less than about 0.1 inches (0.254 cm).

During any impact/shock loading of the product during application in the field, the tolerance in gap 610 provided between the sealed device 20 and bezel 10 may help avoid any contact stresses and damage that may lead to premature failure. Such contact stress may cause or propagate a flaw along the edges 24d of glass display substrate, which may eventually propagate into the frit-seal barrier 24f and allow the penetration of moisture and oxygen, which attack the OLED material.

Referring to FIG. 7A and FIG. 7B, block diagrams illustrate a top view and a front view, respectively, of a seventh exemplary bezel packaging configuration 700 in accordance with one or more embodiments of the present invention. The seventh bezel packaging configuration 700 may include a bezel 10 and bezel modifications 710 designed to stabilize the bezel 10, for instance, to stiffen a bezel side 14, such as a shorter lower wall 14s. In FIG. 7, bezel modifications 710 may include support straps 720 adhered to the backside of the bezel 10 as shown. Support straps 720 may be diagonal, spanning adjoining sides 14, diametrical, spanning opposing sides 14, or a combination thereof. Bezel modifications 710 may be included, for instance, either before or after combination with the device 20. The modified bezel packaging configuration 700 may be employed with any of the embodiments of FIGS. 1-6.

Referring to FIG. 8, a block diagram illustrates a front view of an eighth exemplary bezel packaging configuration 800 in accordance with one or more embodiments of the present invention. The eighth bezel packaging configuration 800 also may include a bezel 10 and bezel modifications 810 designed to stabilize the bezel 10, such as to stiffen a bezel side 14. In FIG. 8, bezel modifications 810 may include thickened sidewalls 820 to create a more rigid bezel 10. Bezel modifications 810 may be included, for instance, during the manufacturing stage before combination with the device 20. Alternatively, modifications 810 may be added after manufacture, before or after combination with device 20, such as by adhering a wall plate onto side 14 to thicken it, post-manufacture. Again bezel packaging configuration 800 may be employed with any of the embodiments shown in FIGS. 1-7.

TABLE 1

Bezel Characterization Drop Test Results

| Manner of packaging device in bezel (bezel orientation) | Drop Height (cm) | | | | Comments |
|---|---|---|---|---|---|
| | 50 | 75 | 100 | 130 | |
| Adhesive Tape (Stainless Steel Bezel Down) | Pass | Fail | Fail | n/a | REFERENCE |
| Low Elastic Modulus Polymer (Stainless Steel Bezel Down) | Pass | Pass | Fail | n/a | FIG. 2 |
| Low Elastic Modulus Polymer (Stainless Steel Bezel Up) | Pass | Pass | Fail | n/a | FIG. 2 |
| Low Elastic Modulus Polymer (Aluminum Bezel Up) | Pass | Pass | Pass | Fail | FIG. 2 |
| Low-elastic Modulus ceramic fiber cloth (Stainless Steel Bezel Down) | Pass | Pass | Pass | Pass | FIG. 1 |
| Low-elastic Modulus ceramic fiber cloth (Stainless Steel Bezel Up) | Pass | Pass | Pass | Pass | FIG. 1 |

Table 1 above summarizes the experimental results of drop tests of bezel packaging configurations in accordance with the present invention. The tests were performed on the first and second exemplary bezel packaging configurations 100 and 200, having frit-sealed glass assemblies as sealed devices 20. The test results show improved mechanical integrity of the tested configurations 100 and 200. The reference case is where a frit-sealed device 20 is simply held in the bezel using any adhesive tape, a common practice in the industry of packaging the sealed device 20 in the bezel 10. A result of "Fail" indicates product failure after impact, whereas a result of "Pass" indicates that the product survived impact without product failure after impact.

In some instances the drop tests were performed to capture the possible effect of orientation of impact, e.g., bezel up or down. "Bezel down" indicates that the bezel (including any form of metal or plastic packaging material) made the first contact with the impact surface, whereas "bezel up" indicates that the surface of the frit-sealed device 20 first hit the impact surface.

It can be inferred from Table 1 that the incorporation of thin layer of low-modulus of elasticity absorbing material such as ceramic (alumino-silicate) fiber cloth significantly improves the threshold of drop height at which product failure occurs, as compared to the common practice of packaging in the industry. The findings demonstrate that a frit-sealed device 20 in a bezel packaging configuration in accordance with the present invention, e.g., configuration 100, is better protected and maintains structural integrity better in response to impact during a drop/freefall test of at least 1.3 meters. As such, refined commercial embodiments of the present invention are expected to perform much better than the industry requires.

The backing material 110, 210, 310, 410, 510 selected for the application to improve the mechanical performance of the bezel/frit sealed assembly should be of materials with low enough elastic modulus to provide shock absorbing/impact resistant properties. The shock-absorbing material 110, 210, 310, 410 510 should be of adequate thickness to allow activation of the shock absorbing properties, which depends on the modulus of elasticity of the material 110, 210, 310, 410, 510. For instance, the modulus of elasticity of the fiber cloth material 110 may be in the range of about 1-50 Mpa, about 2-25 Mpa, or about 5-20 Mpa, and a thickness of about 0.001-0.025 inches. The polymeric material 210, 310, 410 (and possibly 510) may have a modulus of elasticity in the in the range of about 0.1 GPa-20 GPa, about 1-10 GPa, or about 2-5 GPa. The bezel 10 and backing material 110, 210, 510 advantageously would be electrically non-conducting. Preferably the intermediate polymeric material 210, 310, 410, (and possibly 510) should be able to withstand temperature rise due to the accumulated heat generated by the OLED device during operation and use. For example, intermediate material 110, 210, 510 may include various commercially available foam material, both rigid and flexible foam or epoxy.

The present invention also covers the selection of materials for the bezel 10, which advantageously may be stiff and yet be able to absorb impact energy. The bezel 10 design may include a commonly available frame made through a low-cost manufacturing process such as stamping. A bezel 10 manufactured through injection molding or stamping processes advantageously may be cost-effective and yet shock-resistant. Bezels 10 may be made, for instance, of acrylate, plastics, composite materials, aluminum and/or stainless steel, and be coupled with intermediate shock absorbing layer 110, 210, 310, 410, 510, as discussed in more detail below. Naturally, the concept of shock absorption denotes different levels of rigidity and modulus values when applied to the bezel 10 than when applied to the intermediate shock absorbing layer 110, as demonstrated by the exemplary materials for each.

Referring to FIG. 9, a block diagram illustrates a front view of a ninth exemplary bezel packaging configuration 900 in accordance with one or more embodiments of the present invention. The ninth bezel packaging configuration 900 may include a bezel 10, a desirable gap tolerance 610 between walls 14 of bezel 10 and edges 24 of sealed device 20 to prevent any direct contact of the two components. The gap 610 may be filled with an organic adhesive 910. The application of such selected organic adhesive material also may provide enhanced mechanical bonding between the two glass substrates 26 of device 20, in addition to maintaining the frit-sealing integrity. This enhance mechanical bonding may be achieved by allowing a limited amount of the organic material 910 to penetrate into the gap area 610 existing between the two glass plates 26, lying outside of the frit line.

If an organic adhesive 910 is used as the low compliant and shock absorbing intermediate layer, it is advantageous if the organic material 910 exhibits low modulus of elasticity, sets at room temperature without the application of external heat, and has acceptable moisture resistance/weathering properties. The organic material 910 may have a modulus of elasticity in the range of about 0.1 -GPa-20 GPa, about 1-10 GPa, or about 2-5 GPa. If the selected organic adhesive requires UV-curing, then it is advantageous for the application of such intermediate layer to reside only in lines below the frit-lines. Such an arrangement may help minimize the risk that low-power density UV light curing might induce thermal damage on the OLED material itself. Such curing process advantageously would stay below 80° C. for the few seconds of exposure.

Figure 10:
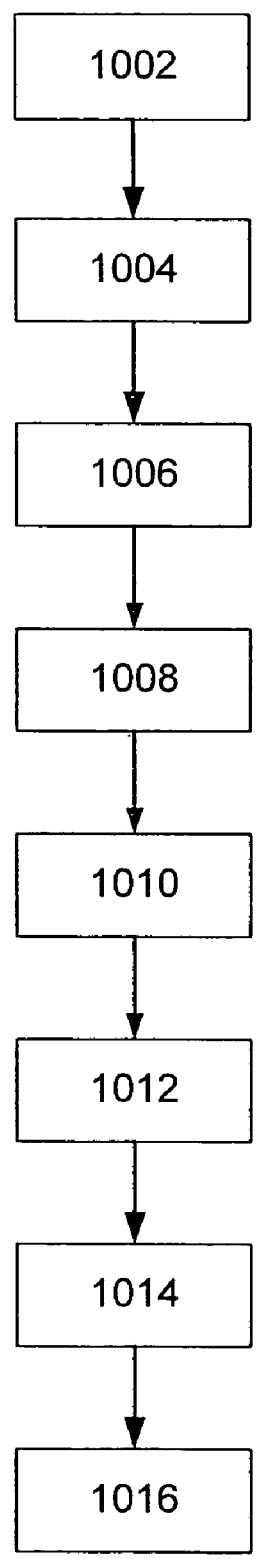
FIG. 10 is a flow diagram illustrating process actions that may be carried out to handle and process product glass in accordance with one or more embodiments of the present invention.

Referring to FIG. 10, a flow diagram illustrates process actions that may be carried out to package sealed glass assemblies in accordance with one or more embodiments of the present invention. An exemplary assembly process 1000 may include some or all of the following actions. The order of the actions is somewhat discretionary and within the skill of a person of ordinary skill in the art to determine, according to the parameters of the desired final product.

In action 1002 of process 1000, a bezel 10 made of impact-resistant material, such as acrylate, aluminum and/or stainless steel, may be provided, possibly including bezel modifications 810 introduced during manufacture of the bezel 10, such as thickened sidewalls 820. Modifications 810, such as thickened sidewalls 820, alternatively may be added in action 1016, such as by adhering a wall plate onto side 14 to thicken it, post-manufacture.

In action 1004, a hermetically sealed glass assembly, such as a frit-sealed OLED device 20 for an OLED display, is provided that matches the bezel 10.

In action 1006, as an intermediate layer between the frit-sealed device 20 and the bezel 10, a relatively thin layer 110, 210, drop 310, or application 410, 510 may be applied of a material with a low elastic modulus, such as ceramic fiber cloth, e.g., alumino silicate fiber cloth used as elevated temperature insulation layer, and/or low modulus of elasticity polymeric organic coating, e.g., a component of Corning CPC6™ acrylate coating.

In action 1008, a bonding agent is used to hold the sealed device 20 tightly to the bezel 10. For instance, the bonding agent may include a commercially available double-sided elevated temperature adhesive tape that is applied with the intermediate layer 110. Another example of a bonding agent might include an organic adhesive 910.

In action 1010, at the same time as action 1008, the device 20 may placed and aligned to provide for clearance 610 such that no direct surface contact occurs between the edges 24 of the frit-sealed device 20 and the walls 14 of bezel 10.

In action 1012, an organic adhesive may be allowed to penetrate and partially fill the gap 610.

In action 1014, as necessary, the bonding agent is enabled, allowed and/or caused to set, such as through passage of time or application of ultraviolet light.

In action 1016, other bezel modifications 710 may be provided, such as support straps 720, where such modifications 710 may be added after bonding has occurred. Modifications 710, such as supports straps 720, alternatively may be added earlier, such as in action 1002.

Although the invention herein has been described with respect to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of packaging a sealed glass assembly in a bezel, the method comprising:
   applying a material with a low elastic modulus to either the sealed glass assembly or the bezel;
   applying a bonding agent between the sealed glass assembly and the bezel; and
   placing the sealed glass assembly in the bezel so that the bonding agent tightly holds the sealed glass assembly to the bezel and the material forms a shock absorbent intermediate layer between the sealed glass assembly and the bezel;
   wherein the bonding agent comprises the material and/or a separate bonding material.

2. The method of claim 1, further comprising:
   aligning the sealed glass assembly in the bezel so that a clearance gap exists between edges of the sealed glass assembly and walls of the bezel.

3. The method of claim 1, further comprising:
   providing an organic adhesive between edges of the sealed glass assembly and walls of the bezel.

4. The method of claim 1, further comprising:
   enabling the bonding agent to set.

5. The method of claim 1, further comprising:
   modifying the bezel with at least one bezel modification that stabilizes the bezel.

6. The method of claim 5, wherein modifying the bezel includes thickening one or more side walls of the bezel.

7. The method of claim 5, wherein modifying the bezel includes attaching one or more support straps to side walls of the bezel.

8. The method of claim 1, wherein the sealed glass assembly includes a frit-sealed glass OLED device.

9. The method of claim 1, wherein the bezel comprises acrylate, plastic, composite material, aluminum and/or stainless steel.

10. The method of claim 1, wherein the bonding agent comprises adhesive tape or an organic adhesive.

11. The method of claim 1, wherein the layer comprises a partial layer covering part but not all of the sealed glass assembly.

12. The method of claim 1, wherein the layer comprises a complete layer covering substantially all of the sealed glass assembly adjoining the bezel.

13. The method of claim 1, wherein the material includes foam, ceramic fiber cloth and/or low modulus of elasticity polymeric organic coating.

14. The method of claim 13, wherein the ceramic fiber cloth comprises alumino silicate fiber cloth and the low modulus of elasticity polymeric organic coating comprises an acrylate coating.

15. A bezel packaging assembly comprising:
    a bezel;
    a sealed glass assembly;
    a shock absorbent intermediate layer of low modulus of elasticity material disposed between the bezel and the sealed glass assembly; and
    a bonding agent affixing the bezel and the sealed glass assembly together;
    wherein the bonding agent comprises the low modulus of elasticity material and/or a separate bonding material.

16. The assembly of claim 15, further comprising:
    a clearance gap between edges of the sealed glass assembly and walls of the bezel.

17. The assembly of claim 15, further comprising:
    an organic adhesive between edges of the sealed glass assembly and walls of the bezel.

18. The assembly of claim 15, further comprising:
    at least one bezel modification that stabilizes the bezel.

19. The assembly of claim 18, wherein the bezel modification includes one or more thickened side walls of the bezel.

20. The assembly of claim 18, wherein the bezel modification includes one or more support straps attached to side walls of the bezel.

21. The assembly of claim 15, wherein the sealed glass assembly includes a frit-sealed glass OLED device.

22. The assembly of claim 15, wherein the bezel comprises acrylate, plastic, composite material, aluminum and/or stainless steel.

23. The assembly of claim 15, wherein the bonding agent comprises adhesive tape and/or an organic adhesive.

24. The assembly of claim 15, wherein the shock absorbent intermediate layer comprises a partial layer covering part but not all of the sealed glass assembly.

25. The assembly of claim 15, wherein the shock absorbent intermediate layer comprises a complete layer covering substantially all of the sealed glass assembly adjoining the bezel.

26. The assembly of claim 15, wherein the low modulus of elasticity material includes foam, ceramic fiber cloth and/or low modulus of elasticity polymeric organic coating.

27. The assembly of claim 26, wherein the ceramic fiber cloth comprises alumino silicate fiber cloth and the low modulus of elasticity polymeric organic coating comprises an acrylate coating.

* * * * *